United States Patent
Shah et al.

(10) Patent No.: US 8,356,968 B2
(45) Date of Patent: Jan. 22, 2013

(54) METHODS AND APPARATUS FOR AN EFFICIENT HANDSHAKE BETWEEN MATERIAL HANDLING AND MATERIAL PROCESSING DEVICES FOR SAFE MATERIAL TRANSFER

(75) Inventors: Vinay K. Shah, San Mateo, CA (US); Sushant S. Koshti, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 12/369,722

(22) Filed: Feb. 11, 2009

(65) Prior Publication Data
US 2009/0202336 A1    Aug. 13, 2009

Related U.S. Application Data

(60) Provisional application No. 61/027,832, filed on Feb. 12, 2008.

(51) Int. Cl.
*H01L 21/677* (2006.01)
(52) U.S. Cl. .................. 414/805; 414/940; 700/228
(58) Field of Classification Search .......... 700/228–229; 414/940, 805
See application file for complete search history.

(56) References Cited

U.S. PATENT DOCUMENTS

| | | | |
|---|---|---|---|
| 5,980,183 A * | 11/1999 | Fosnight | 414/222.01 |
| 6,845,294 B2 * | 1/2005 | Jevtic et al. | 700/228 |
| 7,139,640 B2 * | 11/2006 | Chae et al. | 700/226 |
| 7,151,980 B2 | 12/2006 | You et al. | |
| 7,221,993 B2 | 5/2007 | Rice et al. | |
| 7,413,069 B2 | 8/2008 | Brill et al. | |
| 7,434,676 B2 | 10/2008 | Brill et al. | |
| 2005/0096784 A1 | 5/2005 | Lai | |
| 2006/0045662 A1 | 3/2006 | Aalund et al. | |
| 2007/0282474 A1 | 12/2007 | Schmidt | |
| 2007/0282475 A1 | 12/2007 | Schmidt | |
| 2008/0077273 A1 * | 3/2008 | Gifford et al. | 700/228 |
| 2009/0026039 A1 | 1/2009 | Brill et al. | |

* cited by examiner

*Primary Examiner* — Saul Rodriguez
*Assistant Examiner* — Jonathan Snelting
(74) *Attorney, Agent, or Firm* — Dugan & Dugan, PC (57) ABSTRACT

Methods and systems are provided. The invention includes performing a handshake directly between a load port associated with process equipment and material handling equipment; and transferring a carrier between the material handling equipment and the load port based on the handshake. Numerous other aspects are provided.

14 Claims, 7 Drawing Sheets

FIG. 6

METHODS AND APPARATUS FOR AN EFFICIENT HANDSHAKE BETWEEN MATERIAL HANDLING AND MATERIAL PROCESSING DEVICES FOR SAFE MATERIAL TRANSFER

RELATED APPLICATIONS

The present application claims priority to U.S. Provisional Patent Application No. 61/027,832, filed Feb. 12, 2008, and entitled "METHODS AND APPARATUS FOR AN EFFICIENT HANDSHAKE BETWEEN MATERIAL HANDLING AND MATERIAL PROCESSING DEVICES FOR SAFE MATERIAL TRANSFER", which is hereby incorporated herein by reference in its entirety for all purposes.

FIELD OF THE INVENTION

The present invention relates generally to electronic device manufacturing, and more particularly to methods and systems for transferring carriers between material handling equipment and material processing devices.

BACKGROUND OF THE INVENTION

Processing of substrates (e.g., semiconductor, glass, etc.) for use in electronic devices is typically done in one or more processing systems. Although multiple processing steps may be performed in a single processing system, substrates typically may be transported between processing systems for at least some of the processing steps.

Substrates generally are stored in cassettes or pods (hereinafter referred to collectively as "substrate carriers") for transfer from one processing system to another, and between processing systems and other locations, such as storage locations. Although substrate carriers may be carried manually between processing systems, the transfer of substrate carriers is typically automated. For instance, automatic handling of a substrate carrier may be performed by a transfer robot or vehicle, which may deliver and retrieve substrate carriers from the load port of a process tool. The transfer robot or vehicle may be part of an overhead transport system (OHT system). Any suitable Automated Material Handling System (AMHS) may be used. Conventionally, the transfer robot and the process tool load port are independently controlled. More specifically, typically the robot or vehicle is controlled by the OHT system, and the process tool load port is controlled by the process tool. As such, the process tool and OHT system typically perform a communication handshake, i.e. exchange of communication signals before, during, and after the transfer of a substrate carrier. This handshake may ensure that both entities are prepared for the transfer and perform the correct actions for safe transfer of the substrate carrier. For example, in semiconductor factories, the SEMI E84 standard is typically used for the substrate carrier handoff interface, which may enable safe exchange of the substrate carriers between the transfer robot or vehicle of the OHT system and the process tool load port. The conventional SEMI E84 protocol requires the transfer robot or vehicle to arrive at the process tool load port of the process tool ready to perform a transfer, and then begin the handshake protocol with the process tool. After the handshake protocol has begun, the process tool may accept the transfer and subsequently the transfer robot may then transfer the substrate carrier to/from the load port of the process tool. Alternatively, the process tool may reject the transfer and subsequently the transfer robot or vehicle may abort the transfer. However, a need exists for improved methods and apparatus for substrate carrier handoff.

SUMMARY OF THE INVENTION

In a first aspect, a method is provided. The method comprises performing a handshake directly between a load port associated with process equipment and material handling equipment; and transferring a carrier between the material handling equipment and the load port based on the handshake.

In a second aspect, a system for performing a handshake directly between a load port associated with process equipment and material handling equipment is provided. The system comprises material handling equipment; a load port associated with process equipment; and a controller adapted to perform a handshake between the material handling equipment and the load port.

Other features and aspects of the present invention will become more fully apparent from the following detailed description, the appended claims and the accompanying drawings.

DETAILED DESCRIPTION

The following detailed examples depict several exemplary embodiments of the present invention. Although in some cases the description may seem to imply that the invention may only be practiced in one way, it should be understood that many alternative embodiments are possible and that the specific details disclosed herein are merely provided as examples.

The present invention relates to a "handshake" or communication protocol between material transfer equipment of an automated material handling system (AMHS) and a load port of a process tool, for example, when a material carrier, such as a substrate carrier, for example, is transferred between material handling equipment (e.g., an AMHS robot), for example, and a load port at the process tool. In an electronic device manufacturing facility, for example, the handshake protocol is typically defined in SEMI E84. The problem with this method is that the OHT system component actively performing the transfer, the transfer robot or vehicle, for example, is already committed to perform the transfer even before the handshake begins. For example, to deliver a substrate carrier, the OHT retrieves the substrate carrier from its source location and brings it to the destination process tool load port before beginning the handshake. The process tool associated with the load port could deny the transfer, or simply not respond to the transfer request, in which case the OHT system spends time either re-trying the handshake protocol, or taking the substrate carrier back to its source location or an alternate location.

For an electronic device manufacturing facility that uses small lot carriers (defined below), this delay may cause poor performance for multiple reasons: 1) if the transfer component, such as a robot, is delayed in performing a load port transfer, the robot may not be available in time to perform an upcoming scheduled transfer to or from the OHT system, causing a substrate carrier to have to travel all the way around the OHT system before the substrate carrier may be unloaded from the OHT system conveyor, 2) for small lot manufacturing facilities, the number of substrate carrier transfers becomes very high, the utilization of the robot becomes very important for maintaining process tool utilization, and therefore robot delays are preferably avoided.

Embodiments of the present invention may provide improved methods for accommodating the use of small lot sized carriers in a small lot automated material handling system (AMHS), which may replace a conventional OHT or other AMHS systems. The AMHS of the present invention may incorporate a tool station, located in front of the process tool, and a continuously moving conveyor that may move small lot substrate carriers through the factory. The tool station may be a local substrate carrier buffer providing multiple shelves for the temporary storage of substrate carriers. The tool station may also include an AMHS robot for performing the exchange of substrate carriers between the continuously moving conveyor, the temporary storage shelves, and the process tool load ports, for example. In particular, the methods of the present invention may allow two aspects of the handshake to occur differently: 1) the present invention may enable the AMHS robot to perform other tasks during "non-critical" portions of the handshake or transfer, such as negotiation and reconciliation portions of the handshake, and only commit to the transfer during the exchange portion of the transfer once the load port has already accepted the transfer request and 2) the present invention may define the handshake to be directly between the entities performing the transfer (e.g., the AMHS tool station (e.g., an AMHS robot) and the load port). Conventionally, the handshake is with the process equipment or tool, which monitors the load port status and relays messages to the OHT system. Furthermore, since the communication in the present invention is directly between the tool station and the load port, some embodiments of the invention can allow the tool station to take control of the load port and command the load port to perform actions in coordination with the actions of the tool station robot in order to perform the transfer. In other embodiments of the invention in which coordinated actions are not required, the load port may simply be required to reject action commands (e.g., dock/undock/open/close, etc.) from the process tool.

In more general terms, the present invention provides methods for transferring control of a loading/unloading device between the load ports of process equipment and material handling equipment, such as the AMHS, for example, in an electronic device manufacturing facility. Embodiments of the invention facilitate the material handling equipment, such as a tool station (via an AMHS robot, for example) performing a handshake directly with the loading/unloading device, such as a load port, instead of through an intermediary (e.g., the process equipment). In some embodiments, the present invention further provides methods by which passive portions of the handshake may occur in parallel with other activities of the material handling device. These parallel activities may enable the material handling device to perform other tasks while the loading/unload device is being prepared for the substrate carrier transfer. In some embodiments, the present invention further provides methods in which the passive portion of multiple handshakes may be ongoing concurrently, which may enable the material handling device to plan multiple transfers in advance. The material handling device may therefore begin a subsequent transfer immediately upon completion of the previous transfer. The material handling device may also schedule the transfer at a time in the future when the material handling device will be available to perform the transfer, which may enable maximum utilization of the material handling device by allowing tight scheduling of its activities.

Figure 1:
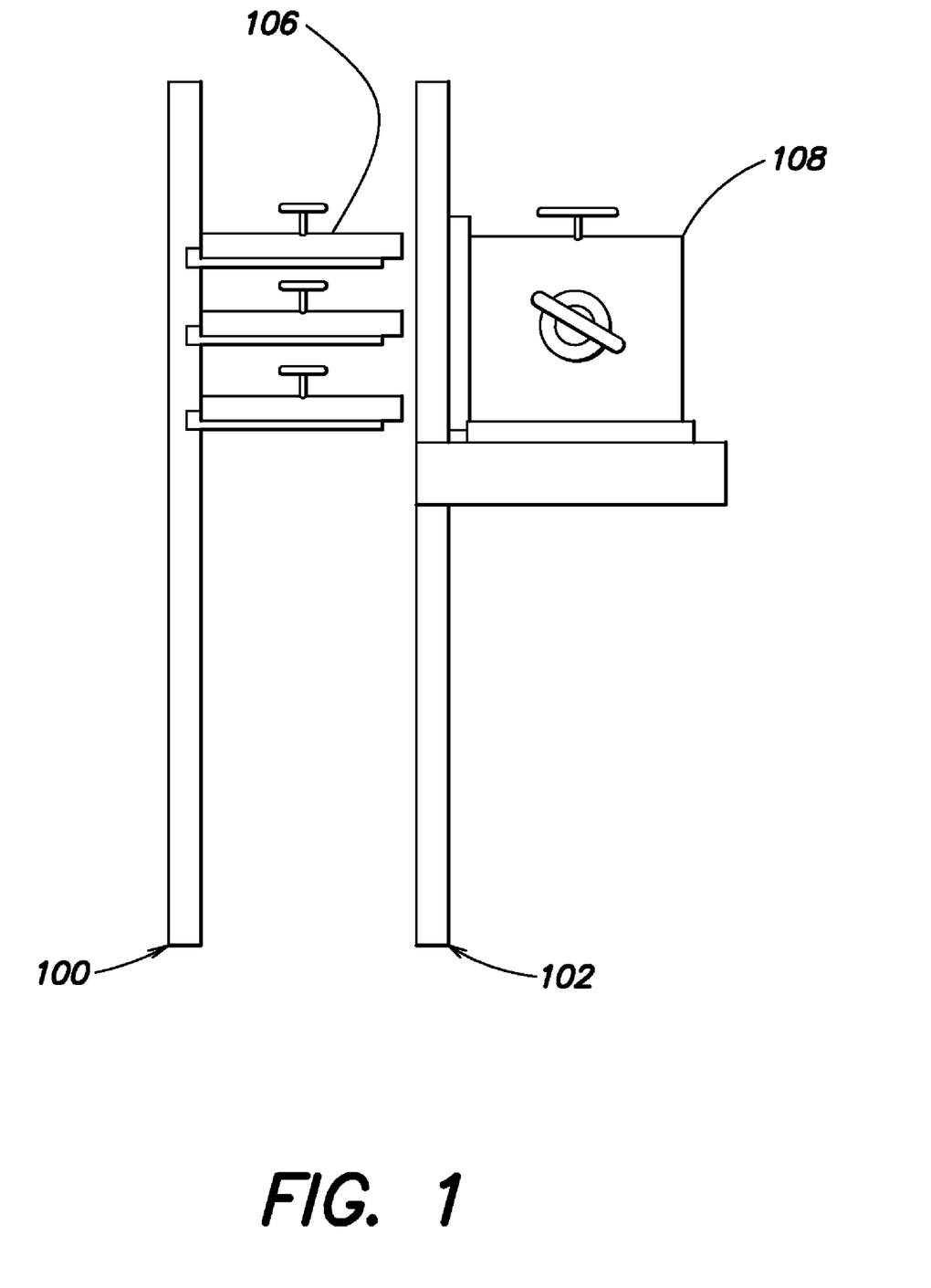
FIG. 1 is a schematic side view of a small lot load port and a large lot load port according to some embodiments of the present invention.

Turning to FIG. 1 a schematic side view of a small lot load port 100 and a large lot load port 102 according to some embodiments of the present invention are provided. In modern electronic device manufacturing facilities, multiple pieces of work material (e.g., substrates such as silicon wafers, glass panels, etc.) may be transported in protective boxes called substrate carriers 106, 108 (e.g., front opening unified pods (FOUPs)). In some embodiments, the same size Box Opener/Loader to Tool Standard (BOLTS) opening (e.g., as defined by the SEMI E63 standard or the like) at the process equipment load port, may be provided in both the small load port 100 and the large load port 102 embodiments. As shown herein, the BOLTS opening for the small lot load port 100 may accommodate one or more (for example 3) small lot substrate carriers 106 at the same time, while the BOLTS opening for the large lot load port 102 may accommodate one large lot substrate carrier 108. In other words, the same size BOLTS opening may accommodate multiple small lot substrate carriers 106 or a single large lot substrate carrier 108. In some embodiments, the large lot load port 102 may accommodate one or more small lot substrate carriers 106. Typically electronic device manufacturing facilities include multiple load ports.

As used herein, a "small lot" size substrate carrier 106 refers to a substrate carrier that is adapted to have a maximum capacity that holds significantly fewer substrates than a conventional "large lot" size substrate carrier 108, which typically holds 13 or 25 substrates (e.g., a maximum capacity of less than 13 substrates). As an example, in one embodiment, a small lot size substrate carrier 106 is adapted to hold 5 or less substrates. In some embodiments, a small lot size substrate carrier 106 is adapted to hold 2 or less substrates. Other small lot size carriers 106 may be employed (e.g., small lot size carriers 106 that hold 1, 2, 3, 4 or more than 5 substrates, but significantly less than that of a large lot substrate carrier 108.) In general, each small lot size substrate carrier 106 may hold too few substrates for human transport of substrate carriers to be viable within a semiconductor device manufacturing facility.

The substrate carriers 106, 108 may be delivered to load ports 100, 102, associated with processing equipment 202, 302 (FIGS. 2, 3) via an overhead transport system (OHT system) or other type of Automated Material Handling System (AMHS) 204, 304 (FIGS. 2, 3), respectively. Conventionally, the process equipment 202 and the OHT system 204 use the SEMI E84 standard for carrier handoff interface (or handshake). This standard, entitled "Specification for Enhanced Carrier Handoff Parallel I/O Interface" and available from Semiconductor Equipment and Materials International, is hereby incorporated by reference herein for all purposes. It should be noted that this SEMI E84 standard does not specifically address automated small lot material handling requirements. Use of this standard is intended to enable safe and reliable exchange of large lot substrate carriers 108 between the OHT system 204 and the load port 102 of the process equipment 202. The handoff interface is used because the OHT system 204, which is the active component performing the substrate carrier transfer, and the process equipment 202, which controls the load port 102 as the load port 102 receives or relinquishes the large lot substrate carrier 108, are independently controlled. Additionally the handoff interface is used because the OHT system 204 cannot communicate directly with the load port 102 according to the E84 standard. Without the handoff interface protocol, the OHT system 204 might inadvertently attempt a substrate carrier transfer when the load port 102 is not ready, or the load port 102, or a load port opener, might inadvertently move during the substrate carrier transfer. Both of these scenarios may result in damage to material or equipment.

Figure 2:
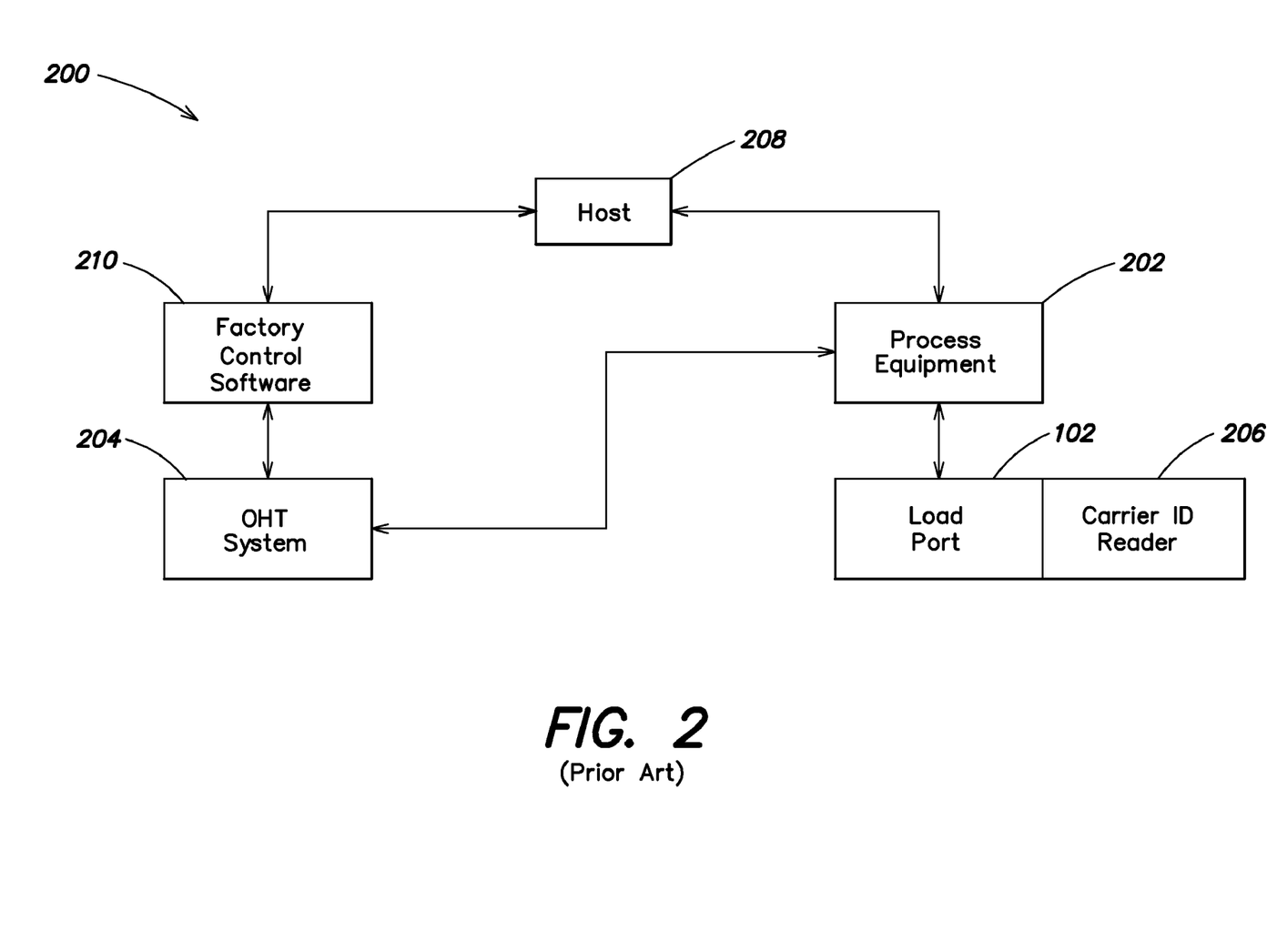
FIG. 2 is a block diagram illustrating a Prior Art handoff interface.

Turning to FIG. 2, a block diagram illustrating a Prior Art handoff interface 200 is provided. As indicated above, the entities performing the substrate carrier transfer (e.g., the load ports 102 and the OHT system 204) are independently controlled and conventionally cannot directly communicate with each other, which is a drawback of the conventional handoff interface 200. Instead, an intermediary 202 (e.g., the process equipment) receives signals from each entity after each step in the transfer sequence, and then, based on the timing and sequence of these signals, the intermediary 202 sends additional signals to each entity 102, 204, to allow or prevent the next step of the transfer sequence. Additionally, a carrier ID read/write device 206 may be used at each load port 102 to determine the identification label associated with the contents of the substrate carrier (e.g., substrate carrier 108). The handoff interface 200 may include a host computer 208 or controller, for example, for controlling operation of the fabrication facility. The host 208 may connect to the process equipment 202. The host 208 may also connect to the OHT system 204 via factory control software (e.g., Material Control System (MCS), manufacturing execution system (MES)) 210. The factory control software 210 may be embedded in the host 208 for transferring messages and issuing commands between the OHT system 208 and the process equipment 202. In other embodiments, the factory control software (FCS) 210 may be part of a separate controller.

In addition, each entity 102, 204 can perform only one handshake at a time. For example, if the OHT system 204 must deliver a substrate carrier 108 to load port #1 102 and then retrieve another substrate carrier 108 from load port #2 102, the OHT system 204 must complete the first substrate carrier transfer at load port #1 102 before it can begin the handshake with load port #2 102. In other words, the substrate carrier transfers could be completed more quickly if the OHT system 204 could begin the handshake with load port #2 102 in advance of completing the first substrate carrier transfer at load port #1 102.

Further, the OHT system 204 must commit itself to perform the substrate carrier transfer without knowing if the process equipment 202 and load port 102 are ready for the transfer. When delivering a substrate carrier 108 under methods in accordance with the E84 Standard, the OHT system 204 must get the substrate carrier 108 from its current location, (e.g. a storage location), bring it to the destination load port 102, and then begin the handshake. If the handshake signals indicate that the load port 102 is not available, then the OHT system 204 must abort the substrate carrier transfer, and deliver the substrate carrier 108 to an alternate destination (typically this is the original location of the substrate carrier 108). Similarly, to retrieve a substrate carrier 108 from the load port 102, the vehicle or component of the AMHS must travel to the load port 102, and then begin the handshake. If the handshake signals indicate that the load port 102 is not available or is otherwise not ready for the transfer, then the OHT system 204 must abort the substrate carrier transfer. Both of these scenarios may result in significant lost time for the transfer robot or vehicle. In factories that require extremely high transfer rates, such as in small lot semiconductor factories, this lost time may prevent the OHT from delivering substrate carriers in time, resulting in the temporary idling of process tools or chambers.

Even more problematic may be that the duration of a substrate carrier transfer is not deterministic, since the load port 102 may need to perform some action in preparation for the substrate carrier transfer (e.g., such as move to a loading position, unlock the substrate carrier 108 that will be removed during the substrate carrier transfer, etc.), or the process equipment 202 or load port 102 may be unavailable for the substrate carrier transfer, or there may be communication delays. This unpredictability in the time required for a transfer may prevent the OHT system from efficiently planning and scheduling the activities of the transfer robots; thereby reducing the rate of transfers that they can perform.

Despite these drawbacks, the current SEMI E84 handshake standard 200 has been widely implemented in electronic device manufacturing facilities. However, conventional electronic device manufacturing facilities typically use large lot sized carriers 108 that, as described above, typically having a capacity of 13 or 25 substrates each. Under this operating condition, the number of substrate carrier transfers at each process equipment 202 is relatively low. For example, process equipment 202 that processes about 200 substrates per hour requires only 8 twenty-five substrate carrier deliveries and 8 twenty-five substrate carrier retrievals every hour to be fully utilized. It is expected that electronic device manufacturing facilities will soon change to small lot manufacturing, in which a small lot substrate carrier 106 will contain a small number of substrates, for example one, two, or three substrates. Under this operating condition with small lot sized carriers 106, for example containing two substrates, the same 200 substrate per hour process equipment now requires 100 deliveries and 100 retrievals every hour to be fully utilized. The delays and inefficiencies described above may prohibit the high-speed carrier transfers required to maintain full process equipment utilization with small-lot manufacturing. Therefore, a new carrier exchange method is desirable to maximize the efficiency of carrier handoffs in a small lot substrate carrier manufacturing environment.

Figure 3:
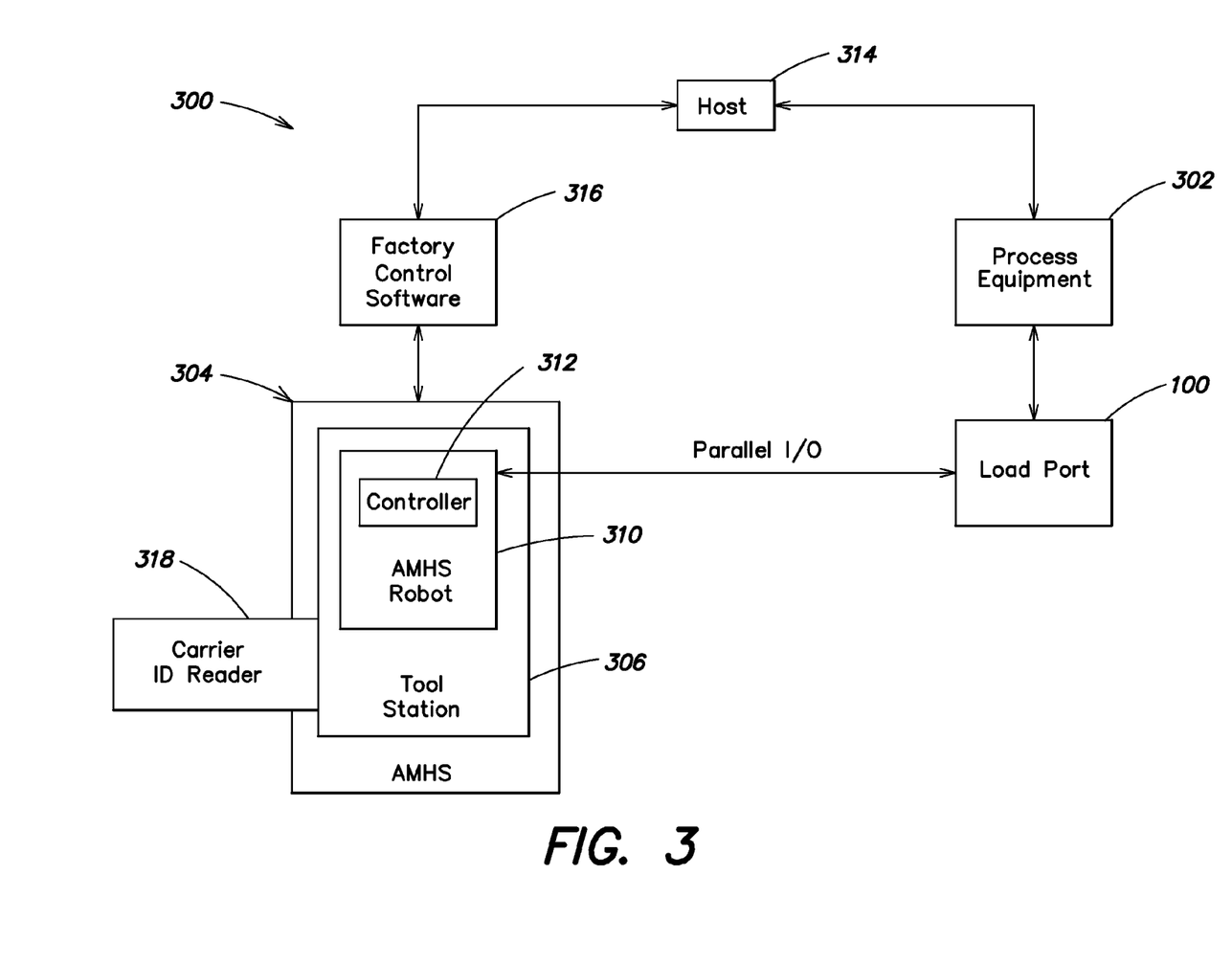
FIG. 3 is a block diagram of a handoff interface according to some embodiments of the present invention.
Figure 4:
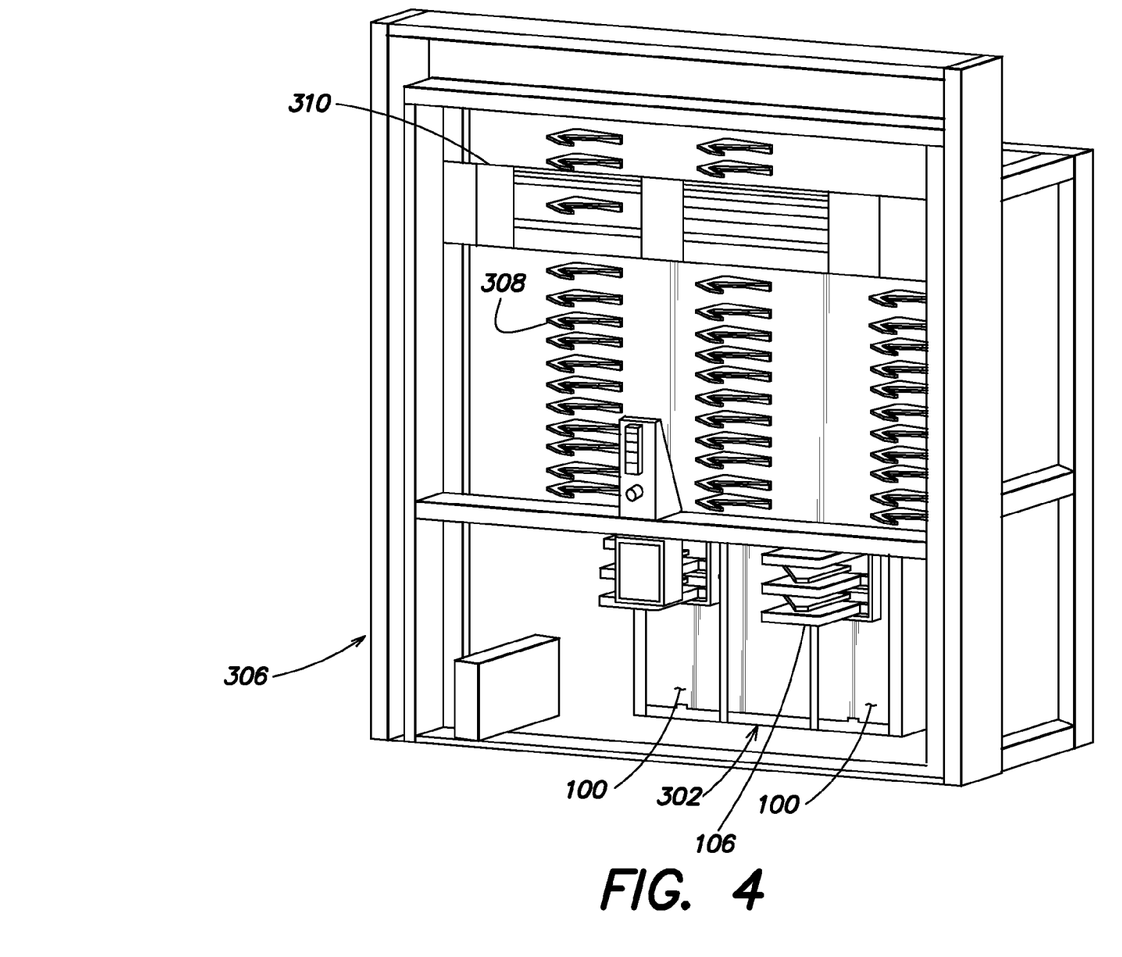
FIG. 4 is a schematic perspective view of a handoff mechanism according to some embodiments of the present invention.

Turning to FIGS. 3 and 4, a block diagram of a handoff interface 300 and a tool station 306 according to some embodiments of the present invention is respectively provided. The issues described above with respect to the conventional interface 200 may be resolved by the handoff interface 300 of the present invention in the following ways. In methods of the present invention, an AMHS 304 may incorporate a tool station 306. The tool station 306 may be a local substrate carrier buffer providing multiple shelves 308 for temporarily storing substrate carriers 106, 108. The tool station 306 may also include an AMHS robot 310, or other device (AMHS robot), that may move in a horizontal and vertical direction to remove the substrate carrier 106 from a conveyor, storage shelf 308, or load port 100, may perform the transfer, and may communicate directly with all load ports 100 that the AMHS robot 310 can access, described below. The communication link may either be individual links between the tool station 306/AMHS robot 310 and each load port 100, individual links between the tool station 306/AMHS robot 310 and groups of load ports 100 or a network link in which the tool station 306/AMHS robot 310 and all load ports 100 are on the same communications network (as in an Ethernet network, for example). In an exemplary embodiment, the communications connection may provide the tool station 306 with direct visibility of changes in a load port sensor state, described below. This may be accomplished by using, for example, optically isolated digital output signals from the load port 100 connected directly to digital inputs on a controller 312 of the AMHS robot 310, or any other connection on the tool station 306, as indicated by the arrow connecting the AMHS robot 310 to the load port 100, 102. The controller 312 may be an electronic logic board, microcontroller such as a single-chip microcontroller, microprocessor, or the like.

In some embodiments, the handoff interface 300 may also include a host 314 which is a computer or controller, for example, for controlling operation of the fabrication facility. The host 314 may connect to the process equipment 302. The host 314 may also connect to the AMHS 304/tool station 306 via factory control software 316 (e.g., Material Control System (MCS), Manufacturing Execution System (MES)). The factory control software 316 may be embedded in the host 314 for transferring messages and issuing commands to the AMHS 304/tool station 306 and the process equipment 302. In other embodiments, the factory control software 316 may be part of a separate controller.

Additionally, in some embodiments, a carrier ID read/write device 318 may be located with the tool station robot 310, as opposed to being located with the load port 102, as indicated in the conventional system above. Locating the carrier ID read/write device 318 with the tool station robot 310 allows the carrier ID to be read and verified prior to transferring the substrate carrier 106; thereby preventing the wrong substrate carrier 106 from being transferred. In conventional semiconductor factories, the carrier ID read/write device is located with the process tool load port, in which case the carrier ID can only be verified after the transfer is completed. Irrespective of the location, the carrier ID read/write device 318 may be used to determine the identification tag associated with the contents of the substrate carrier 106.

In methods of the present invention, when coordinated action between the tool station AMHS robot 310 and the load port 100 are required, the tool station 306/AMHS robot 310 may take control of the load port 100 from the process equipment 302 when performing the substrate carrier transfer, and can give control back to the process equipment 302 when the substrate carrier transfer is completed. When coordinated actions are not needed, the load port 100 may simply be required to reject action commands (e.g., dock/undock/open/close, etc.) from the process tool.

In one embodiment, the tool station 306/AMHS robot 310 may take active control of the load port 100 in which case the tool station 306/AMHS robot 306 may command the load port 100 to perform various actions. For example, the tool station 306/AMHS robot 310 may command the load port 100, 102 to move into a pre-set configuration and to prepare for the substrate carrier transfer. In an exemplary embodiment, the tool station 306/AMHS robot 310 may take passive control of the load port 100. During passive control, the tool station 306/AMHS robot 310 may not issue commands to the load port 100, 102, but may prevent the load port 100, 102 from accepting certain commands that may be issued by the process equipment 302 or other host 314. In this embodiment, the load port 100 may allow the tool station 306/AMHS robot 310 to take control when the load port 100 is already in the correct state for the substrate carrier transfer (for example, in position for loading, locking mechanisms in the unlocked position, etc). In this embodiment the load port 100 then would not accept commands from the process equipment 302 that would cause the load port 100 to move or change state until control is returned to the process equipment 302. The load port 100 may accept commands from the process equipment 302 that cause the load port 100 to report the state of the load port 100 to the process equipment 302, and the load port 100 may also send unsolicited status update messages to the process equipment 302.

In some methods of the present invention, passive sections of the handshake may be performed by the tool station 306 in parallel with other activities of the AMHS robot 310. In order to define which activities may be performed in parallel, the handshake sequence is divided into the following passive and active phases: negotiation, transfer or exchange and reconciliation. The negotiation may be a passive phase, and may be done before the tool station 306/AMHS robot 310 is committed to the substrate carrier transfer. During the negotiation, the tool station 306/AMHS robot 310 may verify that the load port 100 is ready to perform the substrate carrier transfer and the tool station 306/AMHS robot 310 may take control of the load port 100. Because the negotiation may be done before the tool station 306/AMHS robot 310 is committed to the substrate carrier transfer, the AMHS robot 310 may be performing other tasks while the tool station 306 requests permission to access the load port 100. The exchange or transfer phase may be an active phase in which the AMHS robot 310 may be physically moving to perform the substrate carrier transfer. The exchange or transfer phase may begin at any time after the negotiation is complete (e.g., when the substrate carrier transfer fits within the AMHS robot's schedule). The AMHS robot 310 may commit to the transfer by beginning the motion toward the load port 100, to pick up the substrate carrier 106 to be removed from the load port 100, or beginning the motion toward a storage shelf 308 to pick up a substrate carrier 106 to be delivered to the load port 100. Once the load port 100 is committed to the substrate carrier transfer, the "critical" transfer phase may begin when the AMHS robot 310 or material is actually in motion. During this period, tightly controlled communication may ensure the substrate carrier transfer occurs smoothly without danger of damaging the AMHS robot 310 or substrate carrier 106, as well as trigger an abort of the substrate carrier transfer if a load port 100 or tool station 306 error occurs. To provide tightly controlled communication, I/O signals directly between the tool station 306/AMHS robot 310 and the load port 100 may be used. In this way, the tool station 306/AMHS robot 306 may receive signals directly from the entity with which it is performing the transfer (e.g., instead of getting messages relayed from the process equipment). In a preferred embodiment, the I/O signals from the load port 100 may be directly linked to load port sensors (not shown), allowing the tool station 306 to detect changes in state of the load port 100. Once the final signal is received by the tool station 306, the tool station 306/AMHS robot 310 knows that the substrate carrier 106 has safely been transferred, and the AMHS robot 310 may then immediately begin performing other tasks again, while the reconciliation phase is performed by the tool station 306.

During the reconciliation phase, which is a passive phase in which the tool station 306 and load port 100 close the transaction, the tool station 306/AMHS robot 310 may relinquish control of the load port 100 and the handshake is completed. Passive phases may occur in parallel with other AMHS 304 or tool station 306 activities and other transfers; therefore, the AMHS robot 310 may perform the passive phases of multiple substrate carrier transfers at the same time, for example, in order to schedule multiple transfers in advance. Active phases may not occur in parallel with active phases of other transfers. Therefore, the AMHS robot 310 may only perform 1 active phase at a time. Using this method, the tool station 306 may schedule transfers for the AMHS robot 310 in advance by performing the negotiation phase. The robot controller 312 may then determine the optimal time to perform the exchange phase, and is guaranteed that the load port 100 will be ready at that time (since the tool station 306/AMHS robot 310 has active or passive control of the load port 100 after the negotiation phase is completed). The AMHS robot 310 may then perform the exchange phase and may immediately begin performing the next task while the reconciliation phase is performed. In the event of an error during an active phase, the AMHS robot 306 may abort the transfer and then immediately begin other activities because there is no danger to the substrate carrier 106 or equipment. In other words, the tool station 306 may schedule the load port transfer for a convenient time, and it may be possible to guarantee that the load port 100 will be ready to perform the transfer when the scheduled time arrives. When the tool station 306/AMHS robot 310 commits to the transfer, the determination has been made that it is safe to access the load port 100. During the substrate carrier transfer, the tool station 306/AMHS robot 310 may receive status signals directly from the load port 100 indicative as to whether or not the substrate carrier transfer is progressing smoothly. The tool station 306/AMHS robot 310 may also receive an indication that an anomaly has occurred and whether the transaction needs to be aborted. This may allow the fastest possible substrate carrier transfers without lost time due to communication delays, communication errors, etc. Furthermore, the time required to perform the substrate carrier transfer may now be deterministic, because there may be no indefinitely long communication delays. The time for the substrate carrier transfer may basically be the time it takes for the AMHS robot 310 to perform the required move or transfer/motion sequence, and there may be no indefinite delay time spent waiting for signals/messages from a third party. Therefore, the tool station 306 may schedule activities very tightly, or relatively close in time to one another, and may not have to allow a lot of time padding for unexpected communication/handshake delays.

Critical phases of the transfer may occur when there is physical interaction between the AMHS 304/tool station 306 via the AMHS robot 310, substrate carrier 106, and load port 100, and may require other error recovery methods. In some exemplary methods of the present invention, the tool station 306/AMHS robot 310 may automatically recover from errors by aborting a transfer and immediately resuming other activities if the error occurs at a time when there is no danger to equipment or material. In order to define when there is no danger to equipment or material, the exchange phase may be sub-divided into a Critical Exchange and Non-Critical Exchange. Critical Exchange is when physical possession of the substrate carrier 106 is changing between the AMHS robot 310 and load port 100. Non-Critical Exchange may be all other portions of the Exchange phase. For example, during the substrate carrier 106 delivery to the load port 100, the exchange phase may begin when the AMHS robot 310 starts to move to the current location of the substrate carrier 106. The AMHS robot 310 may then retrieve the substrate carrier 106 and move toward the load port 100. This is Non-Critical Exchange. If an error occurs during this time, the AMHS robot 310 can simply abort the transfer, return the substrate carrier 106 to its original location or a location in storage, and then perform the next transfer in its queue. The Critical Exchange may start when the AMHS robot 310 arrives at the load port 100, is directly above the carrier transfer point, and begins placing the substrate carrier 106 onto the load port 100. If an error occurs during this phase, it may not be clear if physical possession of the substrate carrier 106 resides with the AMHS robot 310, the load port 100, or both. Depending on the specific error, it may also not be clear whether or not the load port 100 or AMHS robot 310 has moved to an unsafe position. Therefore, errors during the Critical Exchange may require additional verification, by a human operator, for example, or any other suitable element, before recovery can be performed.

In some exemplary methods of the present invention, the load port 100 may terminate a transfer at any time by sending a signal to the tool station 306/AMHS robot 310 that the transfer should be aborted. In an exemplary embodiment, the signal should be a hardware interlock that is a direct hardware signal to the tool station 306/AMHS robot 310, which may be accomplished by using, for example, an optically isolated digital output signal from the load port 100 directly to a digital input on the controller 312 of the AMHS robot 310. The tool station 306/AMHS robot 310 may automatically recover from this abort signal if the abort signal does not occur during the Critical Exchange, as described above.

Figure 5A:
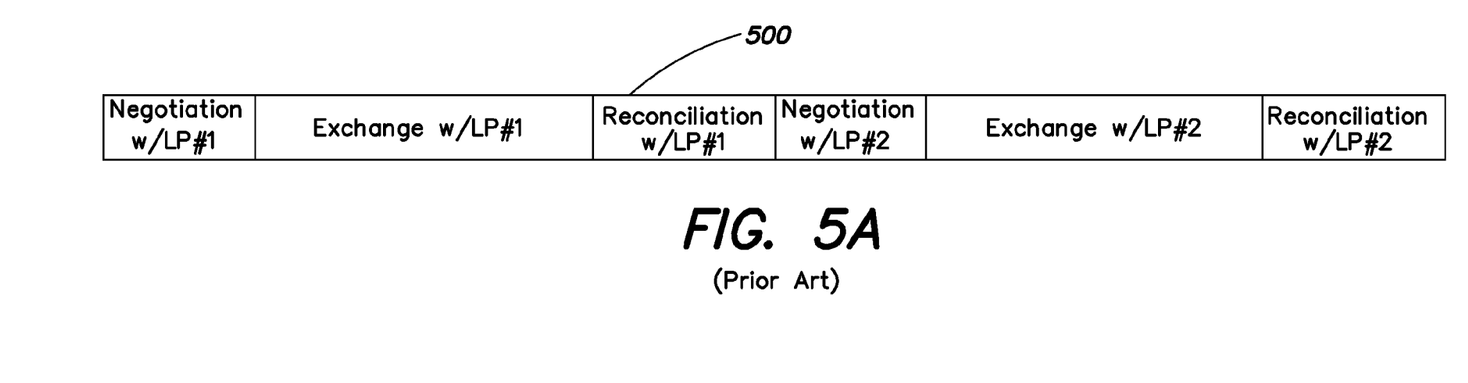
FIG. 5A is a time line describing the handoff interface according to the Prior Art.
Figure 5B:
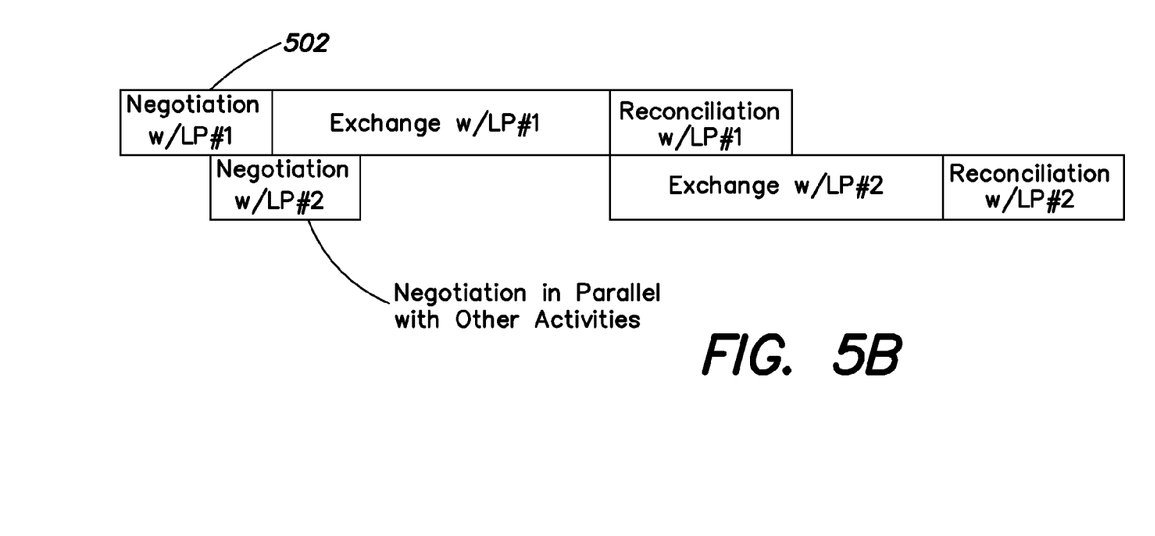
FIG. 5B is a time line describing the handoff interface and according to some embodiments of the present invention.
Figure 5C:
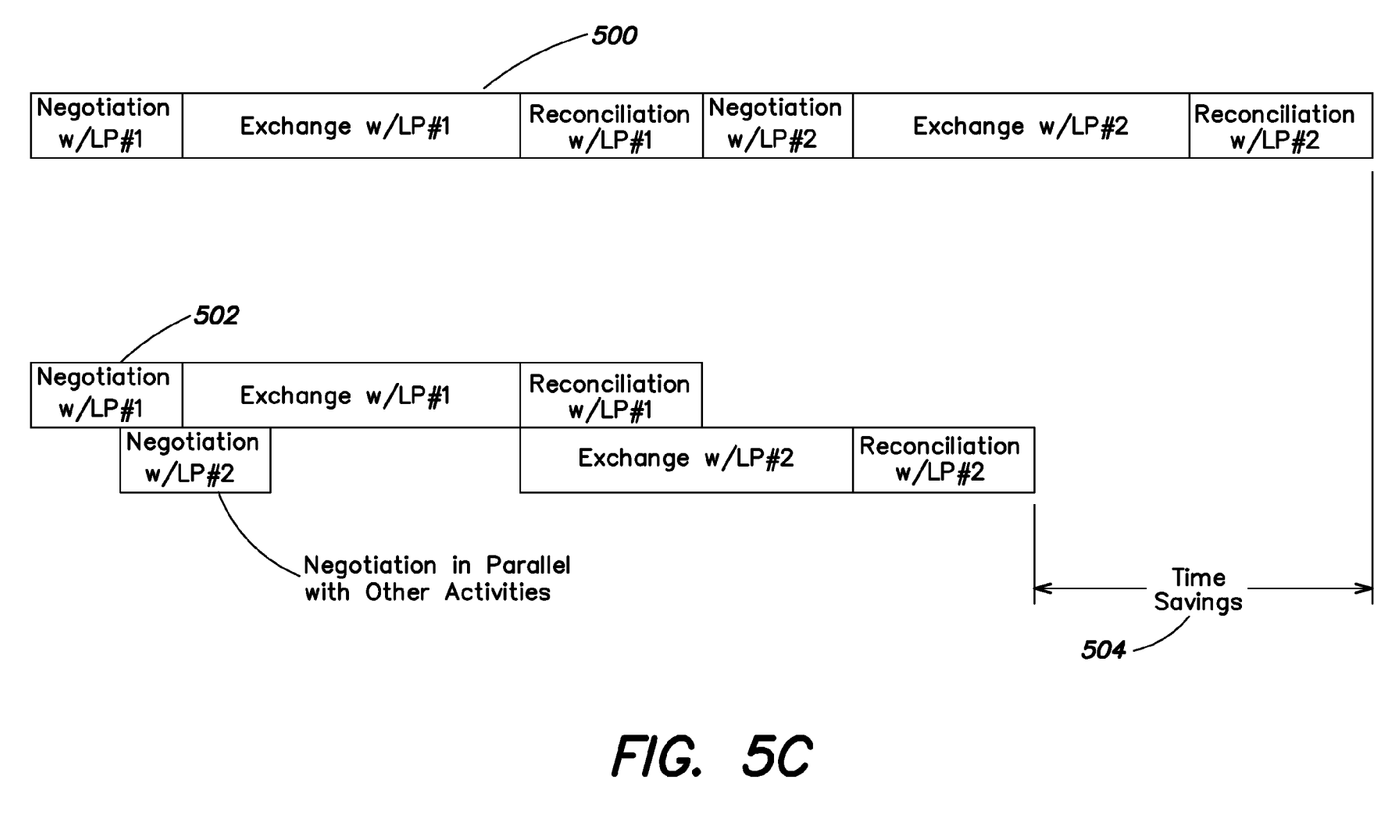
FIG. 5C is a comparison of the time lines shown in FIGS. 5A and 5B.

By using the exemplary methods of the present invention, the tool station 306/AMHS robot 310 may be capable of servicing the load ports 100 of the process equipment 302 faster, and the AMHS robot 310 may be capable of higher utilization rates. This is apparent in FIGS. 5A-5B below, in which the FIG. 5A shows a timeline of two substrate carrier transfers occurring in series 500, as may be conventionally done and FIG. 5B shows a timeline of two substrate carrier transfers in which the passive phases are performed in parallel 502 according to some embodiments of the present invention. The difference in the length of the two timelines, shown in FIG. 5C, represents one aspect of the time savings 504 possible using the present invention.

In some exemplary embodiments, the communication between the load port 100 and tool station 306/AMHS robot 310 is through digital input and output signals. In such embodiments, several signals may be used between the load port 100 and tool station 306/AMHS robot 310 in order to perform a transfer using this method. These signals may define the condition of any substrate carrier transfer at any instant of time, without requiring knowledge of the signal states at a prior time. In some exemplary embodiments, the following are some exemplary signals that may be used:

ACCESS OK: A signal for the load port 100 to indicate to the tool station 306/AMHS robot 310 that control may be taken. This signal may be OFF if the load port 100 is busy executing other commands, if the load port 100 is not ready for a substrate carrier transfer, if the process equipment 302 has reserved control of the load port 100, or if the load port 100 is otherwise unable to grant control to the tool station 306/AMHS robot 310. The signal may be ON if the load port 100 is ready for a transfer and control is available to be taken.

CONTROL REQUEST: A signal for the tool station 306/AMHS robot 310 to request for control to be transferred to the tool station 306/AMHS robot 310.

CONTROL GRANTED: A signal for the load port 100 to accept a control transfer request from the tool station 306/AMHS robot 310.

FOUP PLACED: A signal for the load port 100 to indicate to the tool station 306/AMHS robot 310 that the substrate carrier 106 is correctly placed at the load port 100.

ERROR: A signal for the load port 100 to indicate to the tool station 306/AMHS robot 310 that the load port 100 is in an error state.

Figure 6:
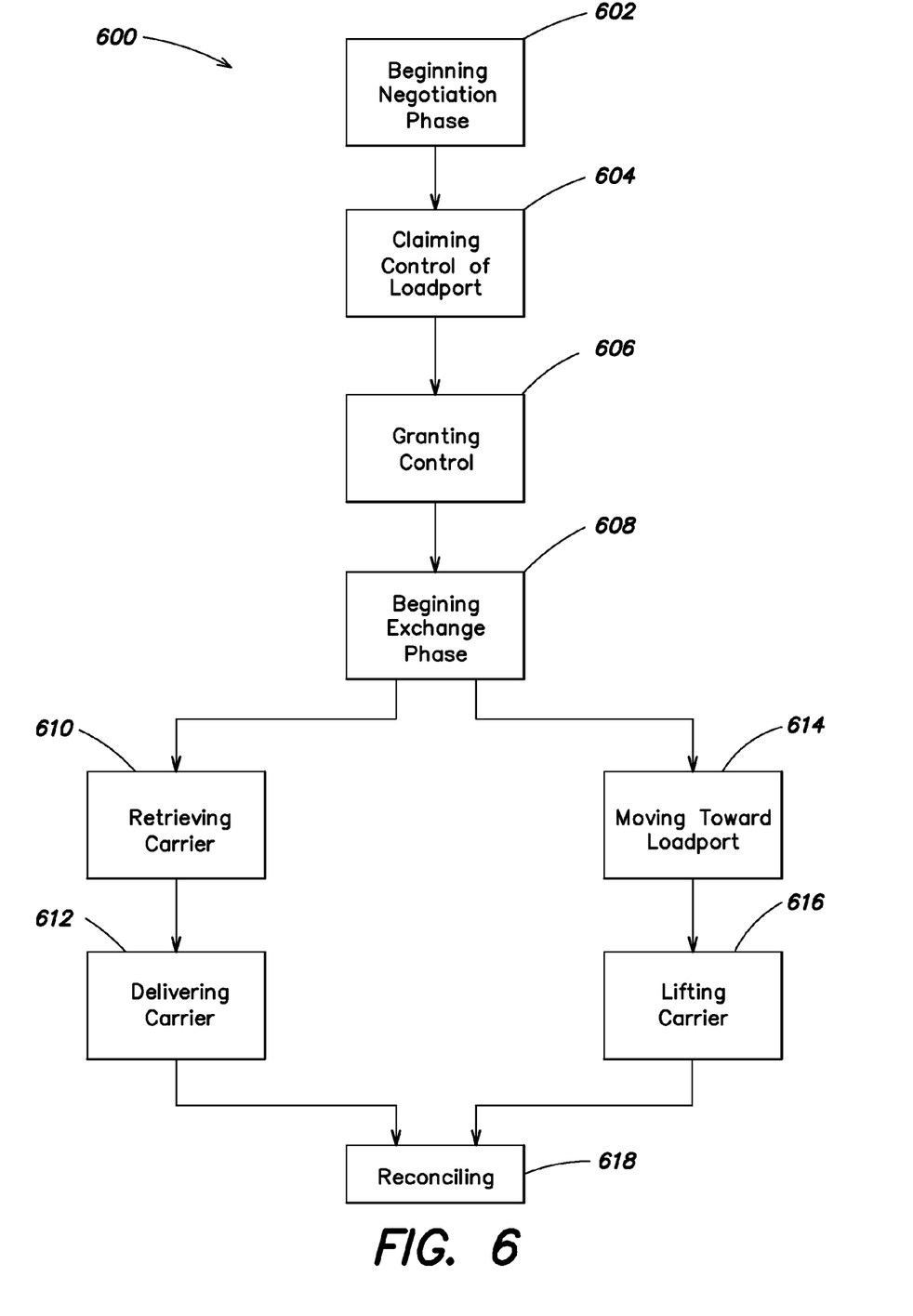
FIG. 6 is a flowchart depicting an example method according to some embodiments of the present invention.

Turning to FIG. 6, an exemplary method 600 in which the tool station 306/AMHS robot 310 and the load port 100 use the signals described above to perform a substrate carrier transfer is provided. The following specific method 600 is provided as an illustrative example and numerous other alternative and additional steps, sub-steps, and/or macro-steps may be possible.

In step 602, when the tool station 306/AMHS robot 310 is ready to begin a negotiation, the tool station 306 may first check the ACCESS OK bit and the FOUP PLACED bit. If the AMHS robot 310 is to deliver a substrate carrier 106, then the FOUP PLACED bit should be OFF (indicating that there is no substrate carrier 106 already present at the load port 100). If the AMHS robot 310 is to retrieve a substrate carrier 106, then the FOUP PLACED bit is set to ON (indicating that there is a substrate carrier 106 present at the load port 100). If the FOUP PLACED bit is correct, and if ACCESS OK is ON, the CONTROL REQUEST bit may be set to claim control of the load port 100 in step 604. The load port 100 may then respond by setting the CONTROL GRANTED bit in step 606. During this phase, the AMHS robot 310 may be performing other activities.

In step 608, the AMHS robot 310 may continue to perform other activities, unrelated to the current substrate carrier transfer, until the AMHS robot 310 is ready to perform the load port transfer, which may mark the end of the negotiation phase and the beginning of the exchange phase.

In the case of a substrate carrier delivery, the AMHS robot 310 may then retrieve the substrate carrier 106 from its current location (for example, a local storage bin) in step 610, and then moves toward the load port 100 to perform the delivery in step 612. The exchange phase may become Critical Exchange when the AMHS robot 310 is slightly above the substrate carrier transfer point at the load port 100 and begins moving downward to place the substrate carrier 106 on the load port 100. The exchange phase ends when the load port 100 changes the FOUP PLACED bit to ON, indicating that the load port 100 has received the substrate carrier 106, and the AMHS robot's internal sensors indicate that the substrate carrier 106 is no longer in its possession.

In the case of a carrier retrieval, the AMHS robot 310 moves toward the load port 100 to perform the retrieval in step 614. The exchange phase becomes Critical Exchange when the AMHS robot 310 is slightly beneath the substrate carrier transfer point at the load port 100 and begins moving upward to lift or retrieve the substrate carrier 106 from the load port 100 in step 616. The exchange phase ends when the load port 100 changes the FOUP PLACED bit to OFF, indicating that the load port 100 is no longer in possession of the substrate carrier 106, and the AMHS robot's internal sensors indicate that the substrate carrier 106 is now correctly placed in its possession.

If the tool station 306/AMHS robot 310 receives the ERROR signal from the load port 100 at any time between the negotiation and the beginning of the Critical Exchange, the tool station 306/AMHS robot 310 may automatically recover as described above. If the tool station 306/AMHS robot 310 receives the ERROR signal during the Critical Exchange, the AMHS robot 306 may not automatically recover and resume other activities without additional error recovery procedures.

Irrespective of whether the exchange phase describes a delivery or retrieval, in step 618, once the exchange phase is completed, the reconciliation phase begins. During this phase, the AMHS robot 310 may resume other activities unrelated to the current substrate carrier transfer. To perform the reconciliation phase, the tool station 306/AMHS robot 310 may turn the ACCESS REQUEST bit to OFF to indicate to the load port 100 that the tool station 306/AMHS robot 310 believes the substrate carrier transfer has been successfully completed. The load port 100 may then turn the ACCESS GRANTED bit to OFF to indicate to the tool station 306/AMHS robot 310 that the load port 100 also agrees that the substrate carrier transfer has been successfully completed.

Numerous other embodiments are also contemplated which use different and/or additional digital I/O signals, and/or use message-based signals. The above specific examples are provided merely to illustrate the invention. The invention is not limited to these specific examples. Accordingly, while the present invention has been disclosed in connection with exemplary embodiments thereof, it should be understood that other embodiments may fall within the spirit and scope of the invention, as defined by the following claim.

What is claimed is:

1. A method for transferring a substrate carrier comprising:
providing a load port associated with a process equipment tool;
providing a controller associated with material handling equipment;
providing a load port sensor adapted to detect a state of the load port and to indicate if the load port is empty, wherein said load port sensor detects an empty load port and indicates that the load port is empty independent of whether the process equipment tool is empty or contains a substrate;
providing a communication link between the load port and the controller associated with the material handling equipment, wherein the communication link provides the material handling equipment with changes in the load port sensor state;
performing a handshake directly between the load port and material handling equipment by transferring isolated input/output (I/O) signals, via the communication link, between the load port and material handling equipment;
transferring a substrate carrier between the material handling equipment and the load port based on the handshake, wherein the handshake comprises an exchange of communication signals before and during the transfer of the substrate carrier; and
exchanging communication signals after transfer of the substrate carrier via the handshake.

2. The method of claim 1 wherein performing a handshake further comprises:
performing a negotiation phase.

3. The method of claim 2 wherein performing a negotiation phase further comprises the process equipment tool granting the material handling equipment control of the load port.

4. The method of claim 2 further comprising:
performing an exchange phase.

5. The method of claim 4 wherein performing the exchange phase further comprises:
retrieving the substrate carrier.

6. The method of claim 5 further comprising:
moving toward the load port.

7. The method of claim 6 further comprising:
delivering the substrate carrier to the load port.

8. The method of claim 4 further comprising:
moving toward the load port.

9. The method of claim 8 further comprising:
retrieving the substrate carrier from the load port.

10. The method of claim 4 further comprising:
performing a reconciliation phase.

11. The method of claim 10 wherein performing the reconciliation phase further comprises:

indicating to the load port that the substrate carrier transfer is complete.

12. The method of claim 11 further comprising:
indicating to the material handling equipment that the substrate carrier transfer is complete.

13. The method of claim 1 wherein the input/output signals are one of access OK, control request, control granted, carrier placed and error.

14. A method for transferring a substrate carrier comprising:
- providing a load port for loading substrates into a process tool;
- providing a controller for controlling an automated material handling system robot to place substrate carriers at the load port;
- providing a load port sensor adapted to detect a state of the load port and to indicate if the load port is empty, wherein said load port sensor detects an empty load port and indicates that the load port is empty independent of whether the process tool is empty or contains a substrate;
- providing a communication link between the load port and the automated material handling system robot, wherein the communication link provides the automated material handling system robot with changes in a load port sensor state;
- performing a handshake directly between the load port and the automated material handling system robot by transferring input/output (I/O) signals, via the communication link, directly between the load port and material handling equipment; and
- initiating movement of the automated material handling system robot toward a substrate carrier for transfer to the load port only after the load port has confirmed availability of the load port via the handshake, wherein the handshake includes an exchange of communication signals at least before the transfer of the substrate carrier.

* * * * *